United States Patent
Reddy et al.

(10) Patent No.: US 6,392,954 B2
(45) Date of Patent: *May 21, 2002

(54) DUAL PORT PROGRAMMABLE LOGIC DEVICE VARIABLE DEPTH AND WIDTH MEMORY ARRAY

(75) Inventors: Srinivas T. Reddy, Fremont; Christopher F. Lane, Campbell; Manuel Mejia, San Jose; Richard G. Cliff, Milpitas; Kerry Veenstra, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/747,191

(22) Filed: Dec. 21, 2000

Related U.S. Application Data (63) Continuation of application No. 09/519,166, filed on Mar. 6, 2000, now abandoned, which is a continuation of application No. 09/107,533, filed on Jun. 30, 1998, now Pat. No. 6,052,327.
(60) Provisional application No. 60/062,966, filed on Oct. 14, 1997.

(51) Int. Cl.[7] .................................................. G11C 8/00
(52) U.S. Cl. ........................... 365/230.05; 365/189.02; 365/230.02
(58) Field of Search ....................... 365/230.05, 189.02, 365/230.02

(56) References Cited

U.S. PATENT DOCUMENTS

| 3,473,160 A | 10/1969 | Wahlstrom | 340/172.5 |
|---|---|---|---|
| 4,593,373 A | 6/1986 | Kiuchi et al. | 364/736 |
| 4,609,986 A | 9/1986 | Hartmann et al. | 364/200 |
| 4,617,479 A | 10/1986 | Hartmann et al. | 307/465 |
| 4,642,487 A | 2/1987 | Carter | 307/465 |

(List continued on next page.)

FOREIGN PATENT DOCUMENTS

| EP | 0 156 316 | 2/1985 | G11C/8/00 |
|---|---|---|---|
| EP | 0 306 726 | 3/1989 | G11C/7/00 |
| EP | 0 509 135 | 10/1992 | B60L/9/00 |
| EP | 0 780 846 | 6/1997 | G11C/5/00 |
| WO | WO 95/16993 | 6/1995 | G11C/11/40 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

(List continued on next page.)

*Primary Examiner*—Son T. Dinh
(74) *Attorney, Agent, or Firm*—Fish & Neave; Robert R. Jackson; Khue V. Hoang (57) ABSTRACT

A dual-port programmable logic device memory array is provided. Selectable-size data words may be written to and read from the array concurrently. Data is written into the array using write column decoder and data selection logic. The size of the data words handled by the write column decoder and data selection logic is controlled by mode select signals. Data is read from the array using read column decoder and data selection logic. The size of the data words handled by the read column decoder and data selection logic is also controlled by mode select signals. The write column decoder and data selection logic may be used to write data into the memory array at one selected location at the same time that the read column decoder and data selection logic is used to read data from the array at another selected location. A write row address decoder and a read row address decoder are used to independently address individual rows of memory cells in the memory array during writing and reading, respectively.

22 Claims, 10 Drawing Sheets

U.S. PATENT DOCUMENTS

| | | | |
|---|---|---|---|
| 4,677,318 A | 6/1987 | Veenstra | 307/465 |
| 4,713,792 A | 12/1987 | Hartmann et al. | 364/900 |
| 4,751,671 A | 6/1988 | Babetski et al. | 364/900 |
| 4,758,745 A | 7/1988 | Elgamal et al. | 307/465 |
| 4,774,421 A | 9/1988 | Hartmann et al. | 307/465 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 4,942,541 A | 7/1990 | Hoel et al. | 364/519 |
| 4,975,601 A | 12/1990 | Steele | 307/465 |
| 5,027,326 A | 6/1991 | Jones | 365/221 |
| 5,121,006 A | 6/1992 | Pedersen | 307/465 |
| 5,128,559 A | 7/1992 | Steele | 307/465 |
| 5,146,428 A | 9/1992 | Tanimura | 365/189.08 |
| 5,220,214 A | 6/1993 | Pedersen | 307/465 |
| RE34,363 E | 8/1993 | Freeman | 307/465 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,274,581 A | 12/1993 | Cliff et al. | 364/784 |
| 5,350,954 A | 9/1994 | Patel | 307/465 |
| 5,371,422 A | 12/1994 | Patel et al. | 326/41 |
| 5,396,608 A | 3/1995 | Garde | 395/400 |
| 5,506,850 A | 4/1996 | Osann, Jr. | 371/22.1 |
| 5,541,530 A | 7/1996 | Cliff et al. | 326/41 |
| 5,543,732 A | 8/1996 | McClintock et al. | 326/41 |
| 5,550,782 A | 8/1996 | Cliff et al. | 365/230.03 |
| 5,559,450 A | 9/1996 | Ngai et al. | 326/40 |
| 5,566,123 A | 10/1996 | Freidin et al. | 365/230.05 |
| 5,592,106 A | 1/1997 | Leong et al. | 326/41 |
| 5,614,840 A | 3/1997 | McClintock et al. | 326/41 |
| 5,689,195 A | 11/1997 | Cliff et al. | 326/41 |
| 5,715,197 A | 2/1998 | Nance et al. | 365/189.02 |
| 5,717,901 A | 2/1998 | Sung et al. | 395/497.01 |
| 5,933,023 A | 8/1999 | Young | 326/40 |
| 6,011,744 A | 1/2000 | Sample et al. | 365/230.03 |

OTHER PUBLICATIONS

*Recent Developments in Switching Theory*, A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al.,"Simplify Sequential Circuit Designs", Electronic Design, Jul. 8, 1971, pp. 70–72.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

*The Programmable Logic Data Book*, 1996, Xilinx, Inc., San Jose, CA, pp. 4–5 to 4–20.

1999 Xilinx Databook, 1999, Xilinx, Inc., San Jose, CA.

DUAL PORT PROGRAMMABLE LOGIC DEVICE VARIABLE DEPTH AND WIDTH MEMORY ARRAY

This application is a continuation of application Ser. No. 09/519,166, filed Mar. 6, 2000 now abandon, which is a continuation of application No. 09/107,533, filed Jun. 30, 1998, now U.S. Pat. No. 6,052,327, which claims the benefit of United States provisional application No. 60/062,966, filed Oct. 14, 1997.

BACKGROUND OF THE IN INVENTION

This invention relates to programmable logic devices. More particularly, this invention relates to dual-port programmable logic device variable depth and width memory arrays.

Programmable logic devices are integrated circuits that are programmable by a user to perform various logic functions. At their most basic level, programmable logic devices contain programmable components, such as erasable programmable read-only memory (EPROM) transistors, electrically erasable programmable read-only memory (EEPROM) transistors, random access memory (REM) transistors or cells, fuses, and antifuses. Higher-level functions are provided by organizing the programmable components into groups of components. The groups of components are electrically connected to one another by programmable interconnections. An illustrative programmable logic device is described in Cliff et al. U.S. Pat. No. 5,689,195.

Programmable logic devices such as those described in U.S. Pat. No. 5,689,195 generally have arrays of random-access memory (RAM) for storing data during device operation. The memory arrays, which are sometimes referred to as embedded array blocks (EABs), are made up of rows and columns of memory cells. The word size used to access data in the memory arrays is generally smaller than the physical dimensions of the memory arrays. For example, a two kilobit (2K) memory array might have 64 rows and 32 columns of memory cells for storing data, whereas the device might use eight-bit data words. When it is desired to read or write a data word, the eight data bits are either retrieved from or written to the memory array.

Memory arrays of this type may be provided with a variable depth and width feature that allows the size of the data word that is used to access the memory array (its "width") and the resulting capacity of the array for data storage (its "depth") to be selectively programmed by the user. A typical 2K variable depth and width memory array can be programmed to have the respective depth and width configurations of: 2K×1, 1K×2, 512×4, or 256×8.

With such variable depth and width memory arrays, data may be either written to or read from the array in words of the selected width. However, these variable depth and width memory arrays do not permit the user to write data to the array and read data from the array simultaneously. Such a capability is needed for applications in which the memory array is used to implement a first-in-first-out buffer or in other such applications in which the memory array is shared between two concurrent processes, one of which reads data from the array and one of which write data to the array.

It is therefore an object of the present invention to provide a variable depth and width memory array for a programmable logic device in which data words may be written to the array and read from the array concurrently.

SUMMARY OF THE INVENTION

This and other objects of the invention are accomplished in accordance with the principles of the present invention by providing a dual-port variable depth and width programmable logic device memory array. Data may be written into a selected write location in the array via a first port with write column decoder and data selection logic and a write row address decoder. Data may be read out of a selected read location in the array via a second port with read column decoder and data selection logic and a read row address decoder. The write column decoder and data selection logic and the write row address decoder operate independently of the read column decoder and data selection logic and the read address decoder. Write operations may therefore be performed independently from read operations. This dual-port feature allows the memory array to be used to implement first-in-first-out buffers and other such memory configurations. The dual-port feature therefore facilitates certain types of data manipulation that would otherwise not be possible.

In an illustrative embodiment, the dual-port memory array handles data widths of 1, 2, 4, 8, and 16 bits. The sizes of the data words handled by the write column decoder and data selection logic are determined by mode select signals. The locations of the columns of the memory array that are addressed during a write operation are determined by write addresses. The number of bits of write column address information used by the write column decoder and data selection logic is determined by the size of the data words to be written to the array. Input registers may be used to register data words up to 16 bits in width prior to providing this data to the write column decoder and data selection logic.

The size of data words handled by the read column decoder and data selection logic are also determined by mode select signals. The locations of the columns of the memory array that are addressed during a read operation are determined by read addresses. The number of bits of read column address information used by the read column decoder and data selection logic is determined by the size of the data words to be read from the array. Output registers may be used to register data words from the array up to 16 bits in width prior to distributing this data on the programmable logic device.

Input multiplexers receive separate and independent read enable and write enable signals for the dual-port memory array that are distributed from interconnects on the programmable logic device. Control logic is used to process these read and write enable signals and to generate correspondingly separate and independent secondary write enable (WE) and read enable (RE) signals. The secondary write enable signal is used by the write row address decoder to address a given row of the array. The location of the row into which data is to be written is determined by a write row address supplied to the write row address decoder from the input multiplexers. The secondary read enable signal is used by the read row address decoder to address a given row of the array. The location of the row from which data is to be read is determined by a read row address supplied to the read row address decoder from the input multiplexers.

In general, the memory array location for writing that is specified by the columns identified by the write column address and the row defined by the write row address differs from the memory array location for reading that is specified by the columns identified by the read column address and the row defined by the read row address. Variable depth and width data words can therefore be written to the array and read from the array using concurrent processes, i.e., one process may write data while the other process reads data.

Further features of the invention, its nature and various advantages will be more apparent from the accompanying

DETAILED DESCRIPTION OF THE PREFERRED EMBODIMENTS

Figure 1:
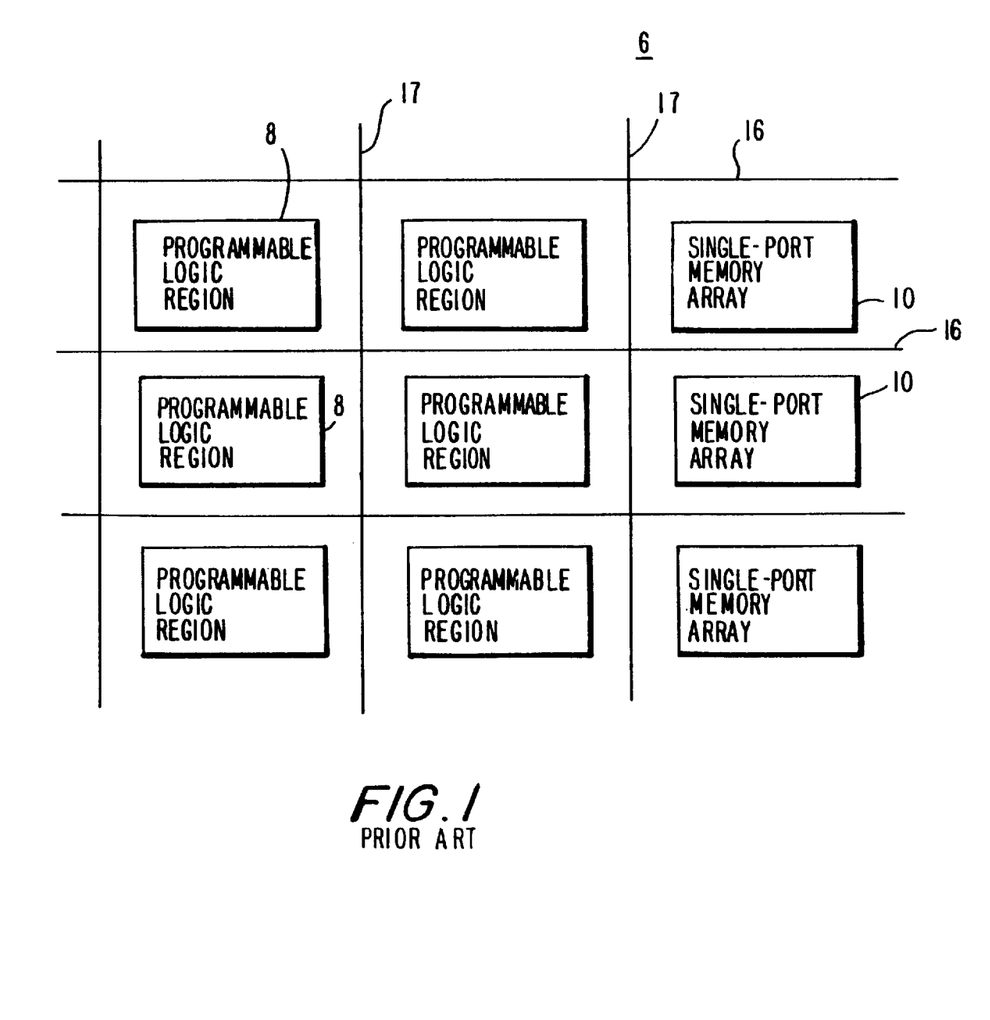
FIG. 1 is a diagram of a conventional programmable logic device that uses single-port variable depth and width memory arrays.

Programmable logic array integrated circuit devices are described in Cliff et al. U.S. Pat. No. 5,689,195, which is hereby incorporated by reference herein. A typical programmable logic device 6 has programmable logic regions 8 arranged in a two-dimensional array of intersecting rows and columns, as shown in FIG. 1. Each programmable logic region 8 may include a number of subregions of programmable logic. Such subregions are typically based on product-term logic or look-up table logic and may include register logic for registering logic signals. The rows and columns of device 6 typically have associated groups of global interconnects 16 and 17 for conveying signals between various logic regions 8.

Some programmable logic devices 6 contain single-port memory arrays 10 with a variable depth and width. In such devices 6, the size of the data word that is used to access each single-port memory array 10 (its "width") and the resulting capacity of the array 10 for data storage (its "depth") may be selectively programmed by the user. A typical 2K variable depth and width memory array can be programmed to have the respective depth and width configurations of: 2K×1 (×1 mode), 1K×2 (×2 mode), 512×4 (×4 mode), or 256 ×8 (×8 mode). Programmable logic devices 6 that contain single-port variable depth and width memory arrays 10 generally contain one such array in each row.

Figure 2:
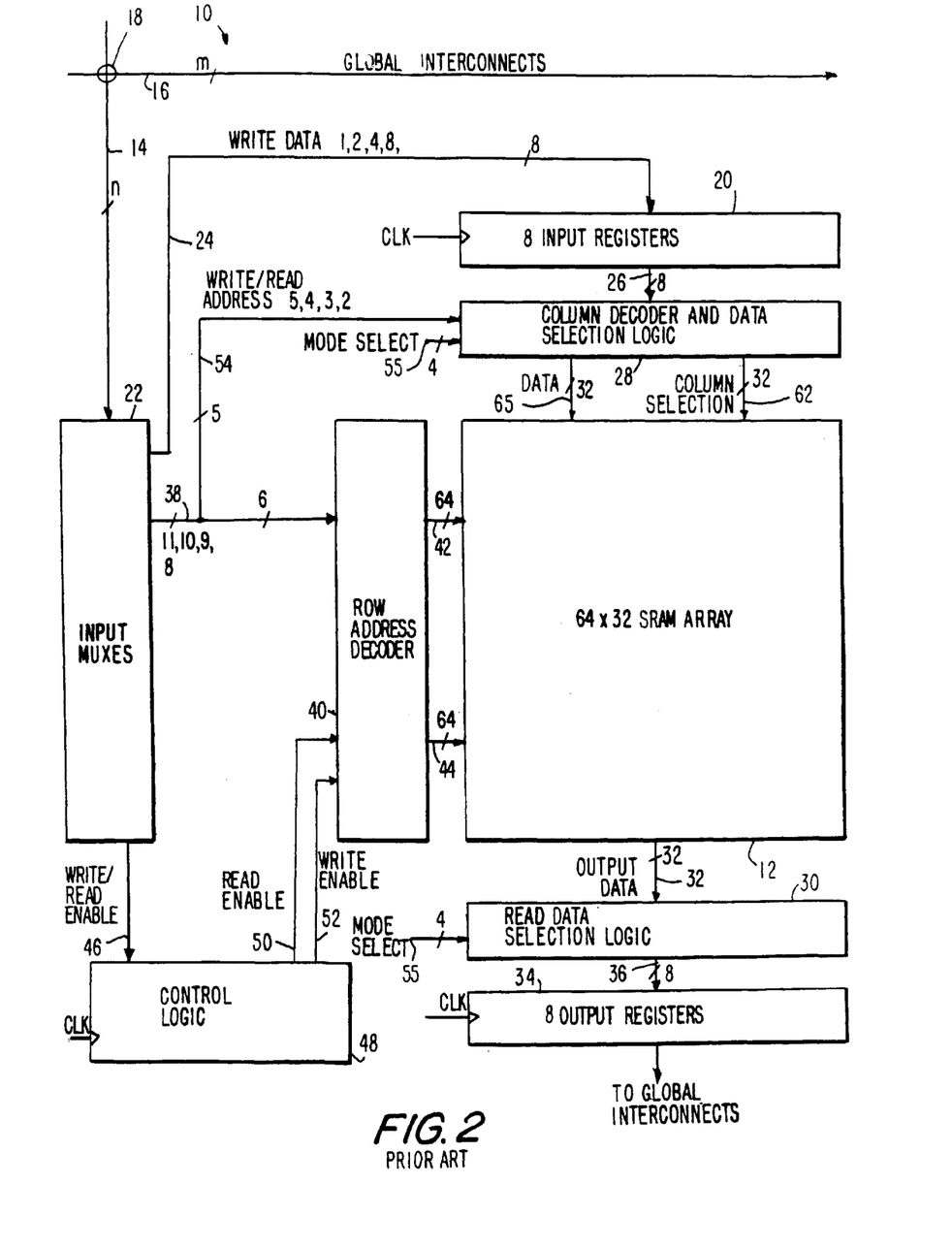
FIG. 2 is a diagram of a conventional single-port variable depth and width memory array.

A typical single-port variable depth and width memory array 10 is shown in FIG. 2. Programmable logic device data is stored in 64 rows and 32 columns of static random-access memory (SRAM) cells in SRAM memory array 12.

Data signals to be written into memory array 12 are supplied on input path 14. The data signals may be routed to array 12 from global interconnects such as global horizontal interconnects 16 using multiplexer circuitry 18. The data signals are distributed to 8 input registers 20 via programmable input multiplexers 22 and write data path 24. The number of data lines in path 24 that are used depends on the selected mode for array 12. One data line is used in the ×1 mode, two data lines are used in the ×2 mode, four data lines are used in the ×4 mode, and eight data lines are used in the ×8 mode. The number of data output lines 26 from input registers 20 that are used is the same as the number of data lines used in path 24 to provide data to input registers 20. Data from input registers 20 may be written into a desired location in memory array 12 using column decoder and data selection logic 28.

Data signals to be read from memory array 12 are supplied to read data selection logic 30 via data output lines 32. Read data selection logic 30 provides the data signals to eight output registers 34 via path 36. Registered data from output registers 34 may be routed to the global interconnects.

In order to address a location in memory array 12 for reading or writing, address signals are supplied to address path 38 via input path 14 and input multiplexers 22. Six of the address signals supplied to address path 38 are used by row address decoder 40 to activate either an appropriate one of 64 read word lines 42 or an appropriate one of 64 write word lines 44.

If it is desired to perform a read operation, a suitable write/read enable signal is supplied via input path 14 and routed to write/read enable 46 by input multiplexers 22. Taking write/read enable 46 low causes control logic 48 to simultaneously take read enable 50 high and write enable 52 low. The read word line 42 that is specified by the address supplied to row address decoder 40 is thus taken high.

If it is desired to perform a write operation, a suitable write/read enable signal is supplied via input path 14 and routed to write/read enable 46 by input multiplexers 22. Taking write/read enable 46 high causes control logic 48 to simultaneously take read enable 50 low and write enable 52 high. The write word line 44 that is specified by the address supplied to row address decoder 40 is thus taken high.

During either reading or writing, the remaining bits of the address supplied on address path 38 are provided to column decoder and data selection logic 28 as a column write/read address via path 54. The column write/read address specifies the location of the columns in array 12 into which data is to be written or from which data is to be read. The number of bits of write/read address information supplied to column decoder and data selection logic 28 depends on the size of the data word in array 12 that is being addressed. For example, five bits of column write/read address information are required when it is desired to specify a particular one of the 32 columns in array 12 into which to write or from which to read a desired one-bit wide data word. Mode select signals are supplied at terminals 55 to configure multiplexer circuitry within column decoder and data selection logic 28 and within read data selection logic 30 so that these components perform the appropriate routing functions needed for the desired mode of operation (i.e., ×1, ×2, ×4, or ×8 mode).

Figure 3:
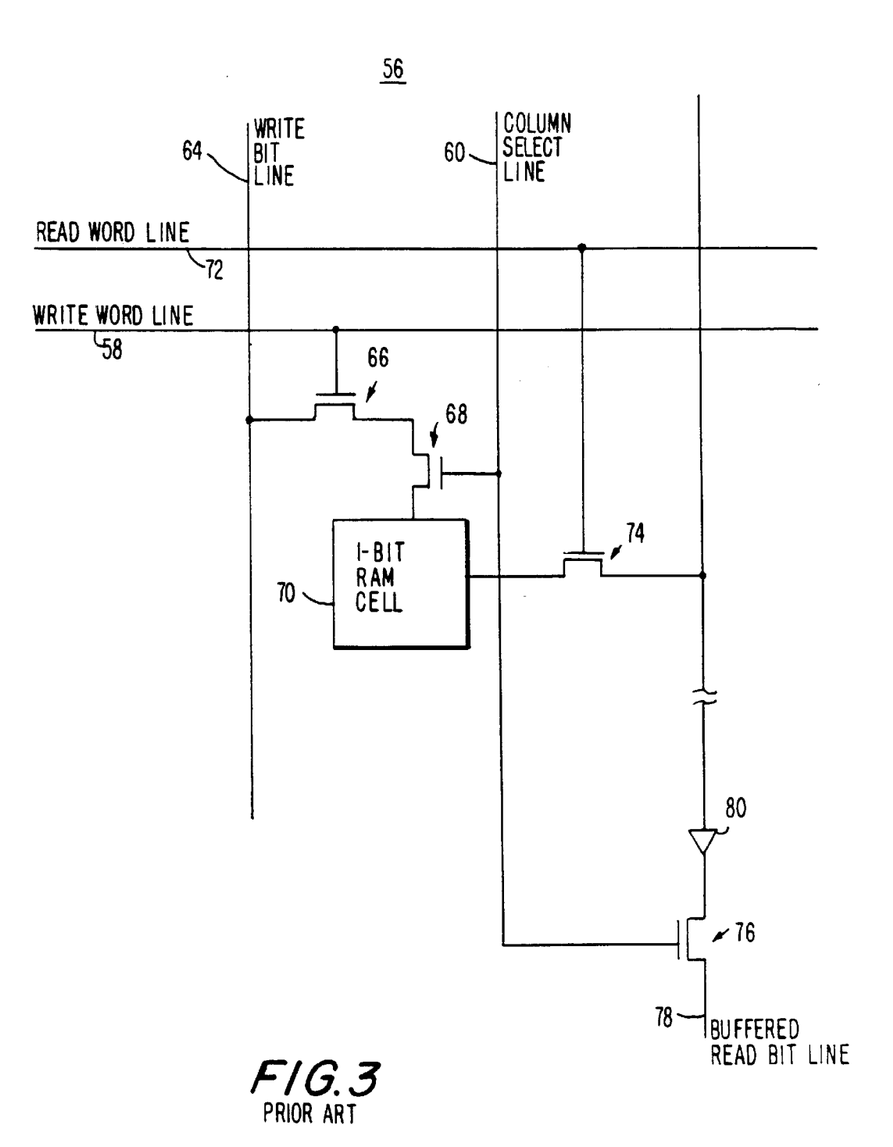
FIG. 3 is a diagram of a conventional memory array cell for use in a single-port variable depth and width memory array.

A typical data storage cell arrangement for a cell 56 in array 12 is shown in FIG. 3. Data may be written into cell 56 by taking write word line 58 (one of write word lines 44 in FIG. 2) high with row address decoder 40 and taking column select line 60 (one of column select lines 62 in FIG. 2) high with column decoder and data selection logic 28 while supplying data to cell 56 via write bit line 64 (one of write bit lines 65 in FIG. 2). This turns on transistors 66 and 68 and causes the data on write bit line 64 to flow into one-bit random access memory (RAM) cell 70.

Data may be read from cell 56 by taking read word line 72 (one of read word lines 42 in FIG. 2) high with row address decoder 40 while taking column select line 60 high with column decoder and data selection logic 28. This turns on transistors 74 and 76 so that data may pass from RAM cell 70 to buffered read bit line 78 (one of data output lines 32 in FIG. 2) via buffer 80.

The variable depth and width memory array arrangement of FIG. 2 allows data to be accessed in various word sizes. Regardless of the word size being accessed, at most a single row in array 12 may be selected at a time. Either a read word line may be taken high for a read operation or a write word line may be taken high for a write operation.

One, two, four, or eight of the columns of memory cells 56 in array 12 may be selected at a time, depending on whether memory array 10 is in the ×1, ×2, ×4, or ×8 mode. In the ×1 mode, five bits of write/read address information from address path 38 are used to select a single column from the 32 columns of array 12. In the ×2 mode, four bits of write/read address information are used to specify the two columns which are to be accessed. In the ×4 mode, three bits of write/read address information are used to specify the group of four columns of array 12 to be accessed. In the ×8 mode, two bits of write/read address information are used to specify the group of eight columns of array 12 to be accessed.

Accessing a given column of memory cells 56 involves taking the column select line 62 of FIG. 2 for that column high while providing the data for the column from input registers 20 to the appropriate write bit line 65 of FIG. 2 for the column using column decoder and data selection logic 28. The columns that are accessed when a group of more than one column of cells 56 is accessed at a time (e.g., when four columns are accessed in the ×4 mode) are typically adjacent.

Figure 4:
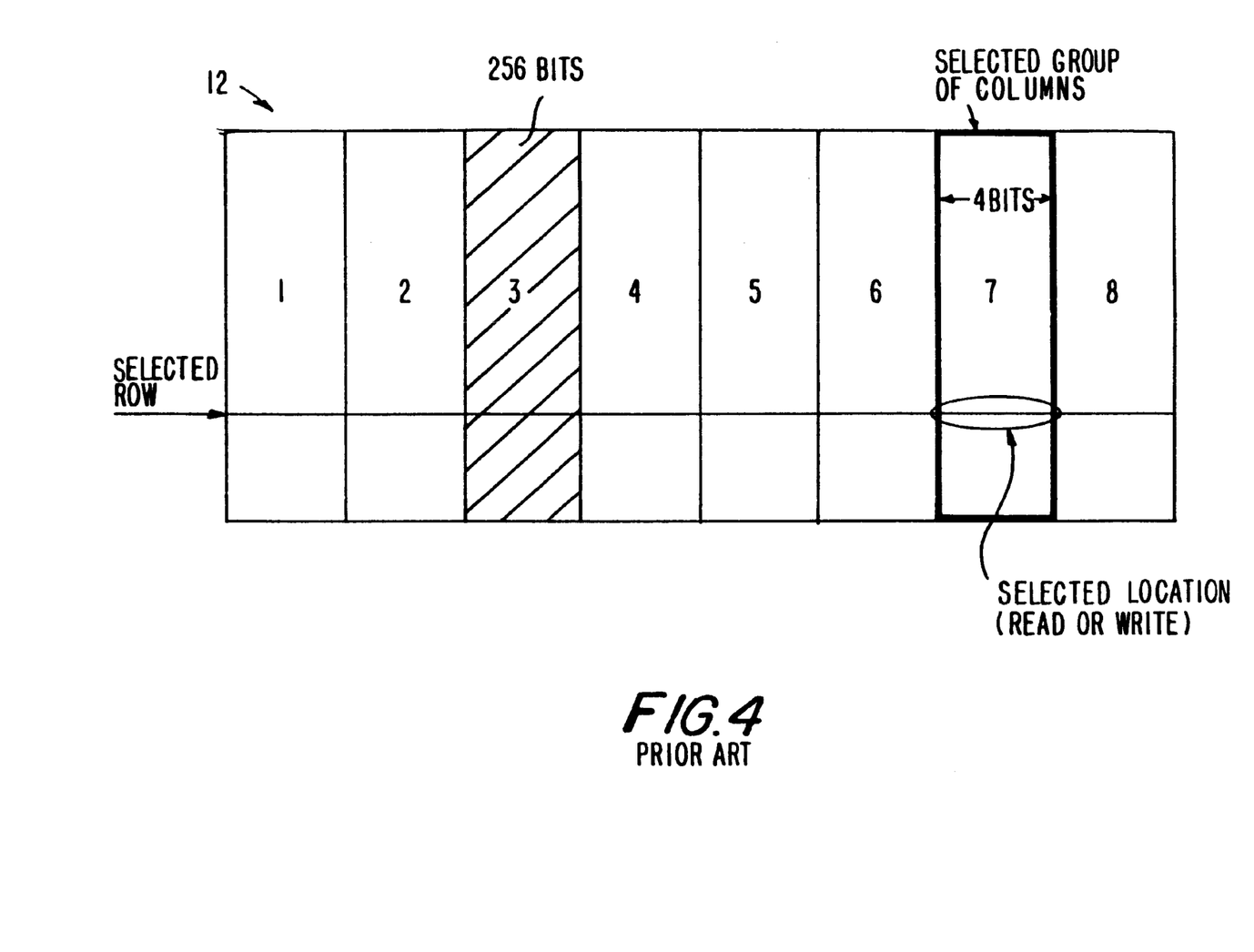
FIG. 4 is a diagram that illustrates the addressing of a selected memory location in a conventional single-port variable depth and width memory array.

This type of arrangement is illustrated in FIG. 4, in which memory array 12 is shown being accessed in the ×4 mode. In the ×4 mode, array 12 may be thought of as being partitioned into eight four-column groups of columns each of which has a capacity of 256 bits (see, e.g., group 3). The total capacity of each four-column group of columns is 256 bits, because there are 64 bits per column. Because there are eight groups and each group has 64 four-bit words, there are a total of 512 four-bit words in array 12, which allows array 12 to operate in the 512×4 configuration in the ×4 mode. The location of a desired four-bit data word can be specified by selecting one of these groups of columns using four of the column select lines 62. For example, column decoder and data selection logic 28 of FIG. 2 may be used to select the columns of memory cells in group 7 of FIG. 4 by taking the four column select lines 62 (FIG. 2) that are associated with group 7 high.

In the ×1 mode, array 12 can be partitioned into 32 groups of columns each of which is one bit wide. In the ×2 mode, array 12 can be partitioned into 16 groups of columns each of which is two bits wide. In the ×8 mode, array 12 can be partitioned into 4 groups, each of which is 8 bits wide.

In the conventional variable depth and width memory array arrangement of FIG. 4, data may be either written to the selected location or may be read from the selected location, but not both at the same time. Data may be written to the selected location in the array by selecting the desired row using a write word line and by providing data to the cells in the selected columns using the appropriate write bit lines. Data may be read from the selected location by selecting the desired row using a read word line and by routing data from the array using buffered read bit lines. However, it is nor possible to write data into array 12 at one selected location while simultaneously reading data from another selected location. The ability to perform such simultaneous reading and writing operations with the memory array is necessary if the memory array is to be used to implement a first-in-first-out buffer or other such memory arrangements.

In accordance with the present invention, a dual-port memory array is provided in which data can be simultaneously written to one location and read from another location. In a preferred embodiment, the dual-port memory array has a user-selectable variable depth and width, although a dual-port memory array of a fixed depth and width may be used if desired.

Figure 5:
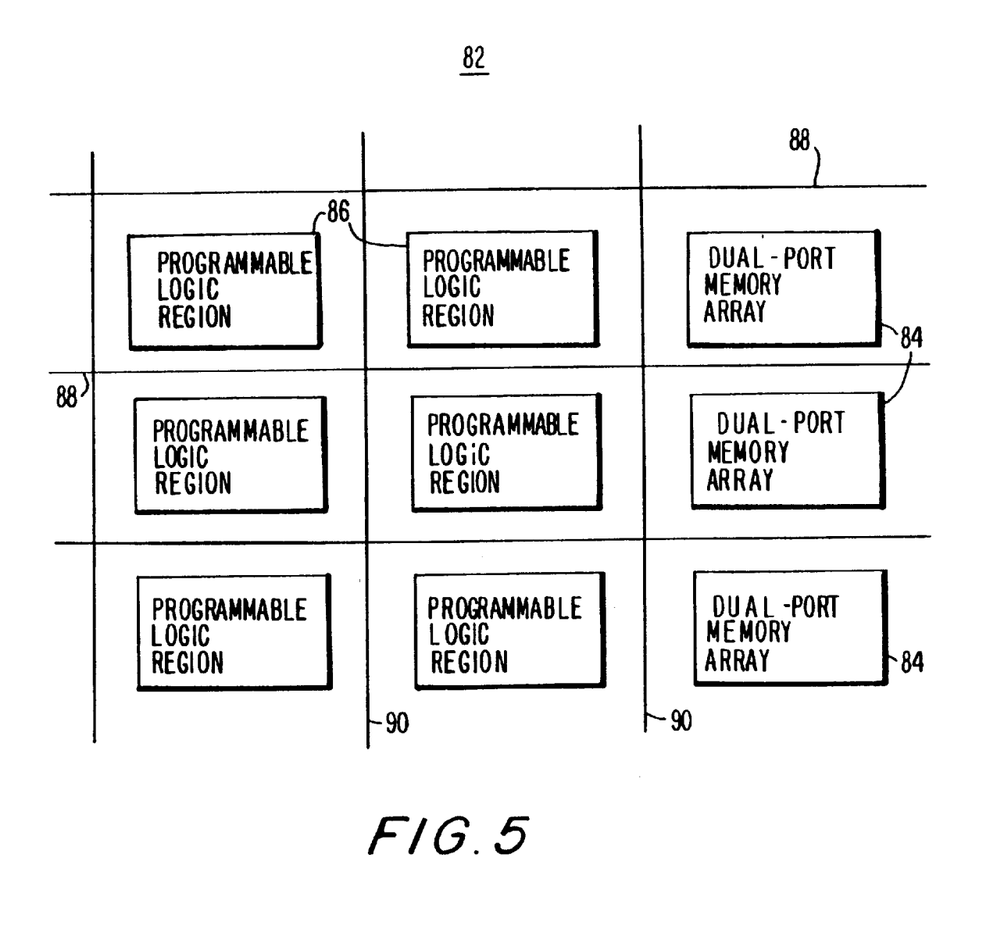
FIG. 5 is a diagram of a programmable logic device containing dual-port variable depth and width memory arrays in accordance with the present invention.

A programmable logic device 82 that contains a number of dual-port variable depth and width memory arrays 84 is shown in FIG. 5. Programmable logic device 82 preferably also contains a number of programmable logic regions 86. Programmable logic regions 86 may be programmed by a user to perform various logic functions. A programmable logic device containing one type of suitable programmable logic regions is described in the above-mentioned Cliff et al. U.S. Pat. No. 5,689,195. If desired, other types of suitable programmable logic regions may be used.

In the arrangement shown in FIG. 5, dual-port memory arrays 84 and programmable logic regions 86 are arranged in intersecting rows and column. This arrangement is illustrative. If desired, any other suitable type of programmable logic device arrangement may be used.

Each programmable logic region 86 may contain a number of subregions of programmable logic. Such subregions may be based on product-term logic or look-up table logic and may include register logic for registering logic signals. The rows and columns of programmable logic regions 86 be interconnected by associated groups of interconnects such as global horizontal interconnects 88 and global vertical interconnects 90. Global interconnects such as interconnects 88 and 90 generally span substantially the entire programmable logic device 82 without interruption, but may also contain half-length interconnects, quarter-length interconnects, eighth-length interconnects or other suitable fractional-length interconnects if desired.

The connections between programmable logic regions 86 and interconnects 88 and 90 and the connections between dual-port memory array 84 and interconnects 88 and 90 are not shown in FIG. 5 to avoid over-complicating the drawing. Such connections may be made by suitable input and output multiplexing and driver circuitry. Circuitry may also be provided to form pathways between horizontal interconnects 88 and vertical interconnects 90. Suitable connections between logic regions and their associated interconnects are described in the above-mentioned U.S. Pat. No. 5,689,195.

In dual-port variable depth and width memory arrays 84, the size of the data word that is used to access each memory array 84 fits "width") and the resulting capacity of the array for data storage (its "depth") may be selectively programmed by the user. In one suitable arrangement, each memory array 84 has a 2K capacity that can be programmed to have the respective depth and width configurations of:

2K×1 (×1 mode), 1K×2 (×2 mode), 512×4 (×4 mode), 256×8 (×8 mode), and 128×16 (×16 mode). Programmable logic device 82 preferably contains one dual-port variable depth and width memory array 84 in each row, as shown in FIG. 5, although other suitable configurations may be used if desired.

Figure 6:
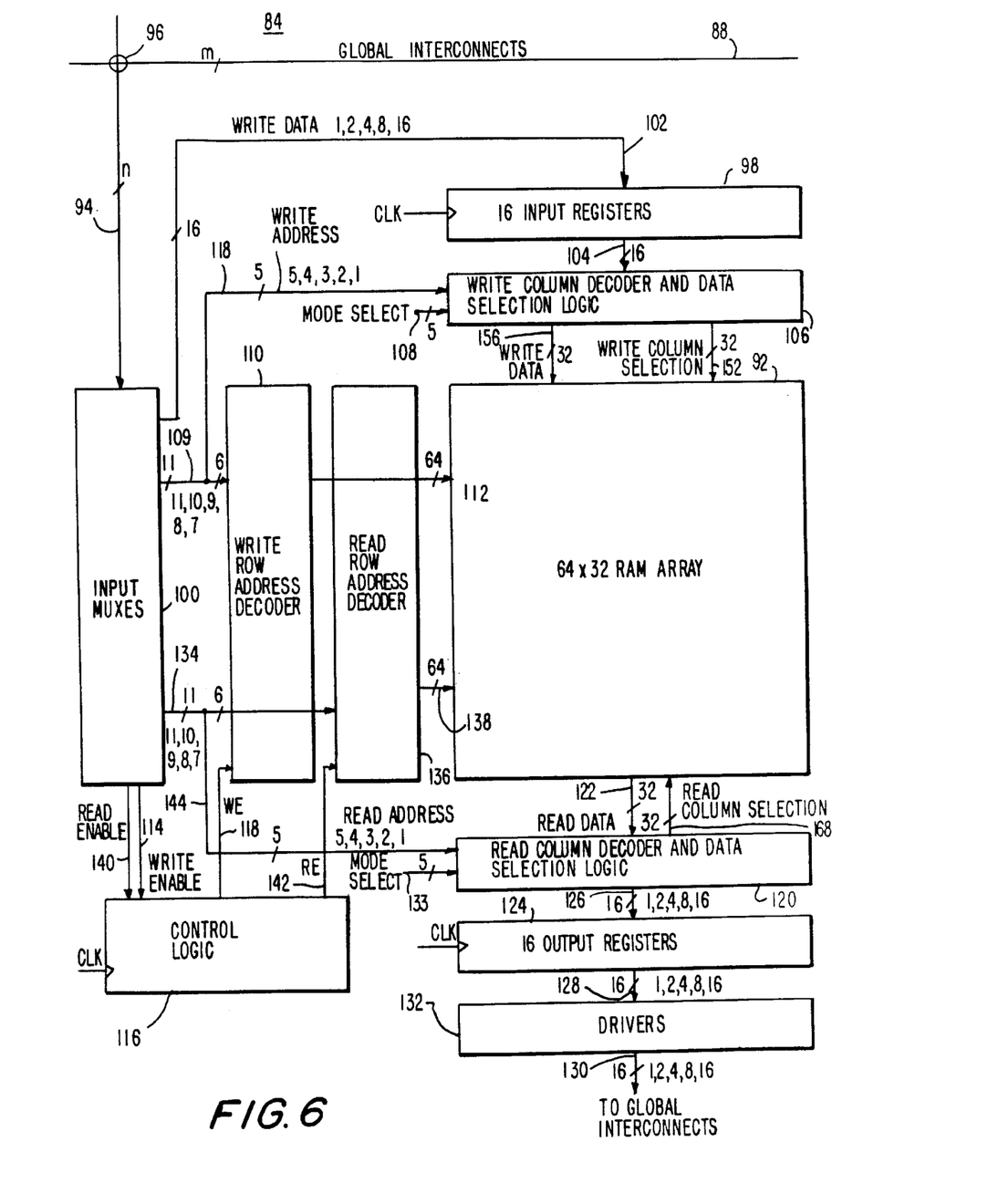
FIG. 6 is a diagram of a dual-port variable depth and width memory array in accordance with the present invention.

An illustrative arrangement for a dual-port variable depth and width memory array 84 is shown in FIG. 6. Programmable logic device data may be stored in 64 rows and 32 columns of random-access memory (RAM) cells in memory array 92. Memory array 92 is preferably a static random-access memory (SRAM) array.

Data signals to be written into memory array 92 are supplied on input path 94. The data signals may be routed to input path 94 from global interconnects such as global horizontal interconnects 88 using programmable multiplexer circuitry 96. The data signals are distributed to 16 input registers 98 via programmable input multiplexers 100 and write data path 102. Write data path 102 forms a first data port. The number of data lines in path 102 that are actively used at a given time depends on the selected mode for array 84. One data line is in active use in the ×1 mode, two data lines are used in the ×2 mode, four data lines are used in the ×4 mode, eight data lines are used in the ×8 mode, and all 16 data lines are used in the ×16 mode. The number of data output lines 104 from input registers 98 that are used is the same as the number of data lines actively used in path 102 to provide data to input registers 98. Data from input registers 98 may be written into a desired location in memory array 92 using write column decoder and data selection logic 106.

The circuitry of write column decoder and data selection logic 106 is used to select locations to which data is to be written in memory array 92 and to route data signals from input registers 98 to those locations during write operations. If desired, write column decoder and data selection logic 106 may use basically the same type of arrangement used in the column decoder and data selection logic circuits of standard variable depth and width programmable logic device memory arrays. As with such column decoder and data selection logic arrangements, patterns of fixed connections and multiplexer circuitry within write column decoder and data selection logic 106 may be used to selectively route signals to their proper destinations based on the selected mode of array 84 (i.e., ×1, ×2, ×4, ×8, or ×16 mode). The circuitry of write column decoder and data selection logic 106 may be configured by supplying suitable mode selection signals to terminal 108.

In order to address a location in memory array 92 for writing, write address signals are supplied to write address path 109 via input path 94 and input multiplexers 100. Six of the write address signals supplied to write address path 109 are used as a write row address by write row address decoder 110 to activate an appropriate one of 64 write word lines 112.

To perform a write operation, a suitable high write enable signal is supplied via input path 94 and is routed to write enable 114 by input multiplexers 100. Taking write enable 114 high causes control logic 116 to take secondary write enable (WE) 118 high. The write word line 112 that is specified by the write row address information supplied to write row address decoder 110 is thus taken high.

The remaining bits of the write address supplied on write address path 109 are provided to write column decoder and data selection logic 106 as a write column address via path 118. The write column address specifies the location of the columns in array 92 into which data is to be written. The number of bits of write column address information supplied to write column decoder and data selection logic 106 depends on the size of the data word in array 92 that is being addressed. For example, five bits of write column address information are required when it is desired to specify a particular one of the 32 columns in array 92 into which to write a desired one-bit wide data word.

Data signals to be read from memory array 92 are supplied to read column decoder and data selection logic 120 via read bit lines 122. Read bit lines 122 form a second data port. Read column decoder and data selection logic 120 provides the data signals to 16 output registers 124 via path 126. Registered data from output registers 124 may be routed to global interconnects 88 and 90 via paths 128 and 130 and drivers 132.

The circuitry of read column decoder and data selection logic 120 is used to select locations from which data is to be read from memory array 92 and to route data signals from those selected locations in memory array 92 to output registers 124 during read operations. If desired, read column decoder and data selection logic 120 may use basically the same type of arrangement used in the column decoder and data selection logic circuits of standard variable depth and width programmable logic device memory arrays. As with such column decoder and data selection logic arrangements, patterns of fixed connections and multiplexer circuitry may be used within read column decoder and data selection logic 120 to selectively route signals to their proper destinations based on the selected mode of array 84 (i.e., ×1, ×2, ×4, ×8, or ×16 mode). The circuitry of read column decoder and data selection logic 120 may be configured by supplying suitable mode selection signals to terminal 133.

In order to address a location in memory array 92 for reading, read address signals are supplied to read address path 134 via input path 94 and input multiplexers 100. Six of the read address signals supplied to read address path 134 are used as a read row address by read row address decoder 136 to activate an appropriate one of 64 read word lines 138.

To perform a read operation, a suitable high read enable signal is supplied via input path 94 and is routed to read enable 140 by input multiplexers 100. Taking read enable 140 high causes control logic 116 to take secondary read enable (RE) 142 high. The read word line 138 that is specified by the read row address supplied to read row address decoder 136 is thus taken high. Because read enable 140 and write enable 114 operate independently, the corresponding secondary write enable (WE) and secondary read enable (RE) signals also operate independently.

The remaining bits of the read address supplied on read address path 134 are provided to read column decoder and data selection logic 120 as a read column address via read address path 144. The read column address specifies the location of the columns in array 92 from which data is to be read. The number of bits of read column address information supplied to read column decoder and data selection logic 120 depends on the size of the data word in array 92 that is being addressed. For example, five bits of read column address information are required when it is desired to specify a particular one of the 32 columns in array 92 from which to read a desired one-bit wide data word.

Figure 7:
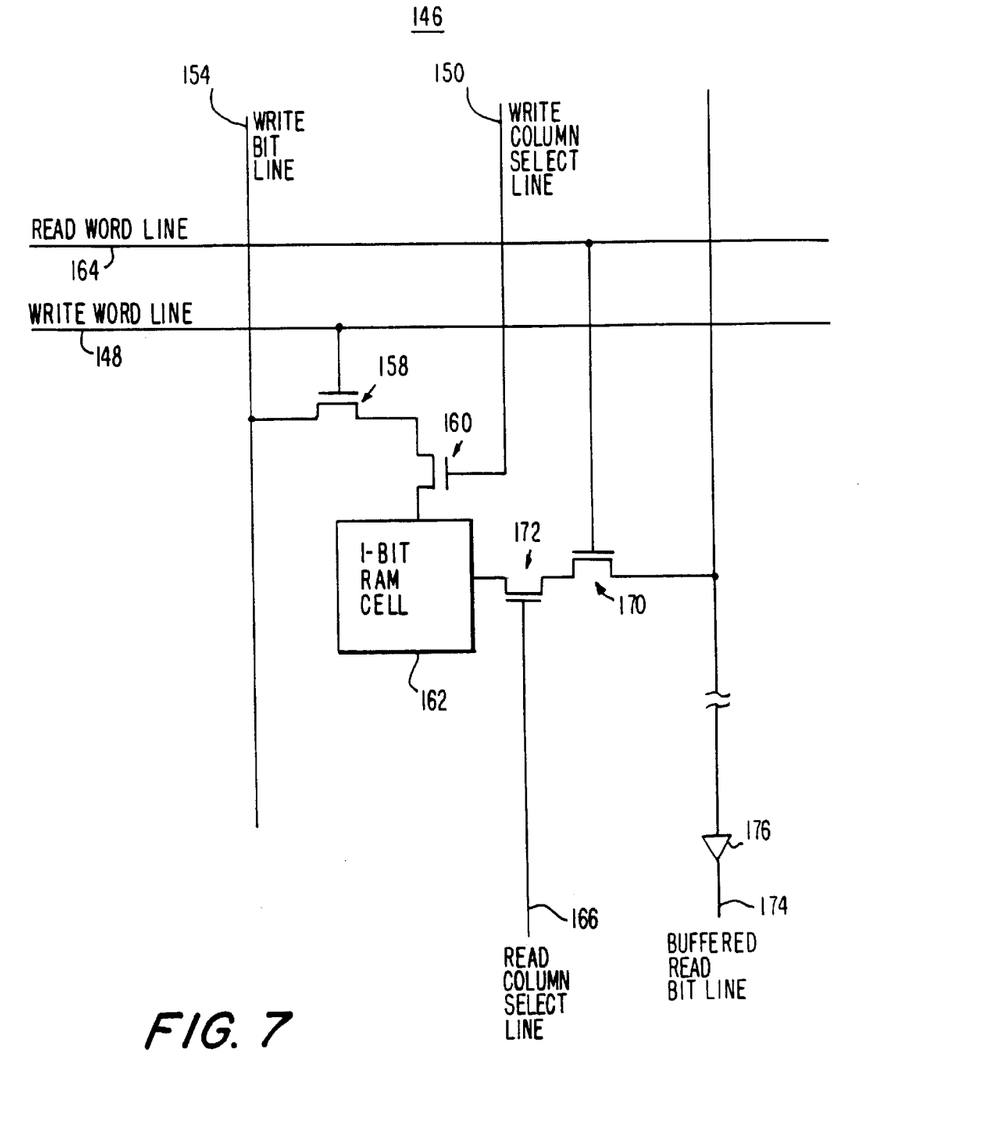
FIG. 7 is a diagram of a memory array cell for use in a dual-port variable depth and width memory array in accordance with the present invention.

A typical data storage cell arrangement for a cell 146 in array 92 is shown in FIG. 7. Data may be written into cell 146 by taking write word line 148 (one of write word lines 112 in FIG. 6) high with write row address decoder 110 (FIG. 6) and taking write column selection line 150 (one of write column selection lines 152 in FIG. 6) high with write column decoder and data selection logic 106 (FIG. 6) while supplying data to cell 146 via write bit line 154 (one of write bit lines 156 in FIG. 6) using write column decoder and data selection logic 106 (FIG. 6). This turns on transistors 158 and 160 and causes the data on write bit line 154 to flow into one-bit random access memory (RAM) cell 162.

Data may be read from cell 146 by taking read word line 164 (one of read word lines 138 in FIG. 6) high with read row address decoder 136 (FIG. 6) and taking read column selection line 166 (one of read column selection lines 168 in FIG. 6) high with read column decoder and data selection logic 120 (FIG. 6). This turns on transistors 170 and 172 and causes the data in one-bit random access memory (RAM) cell 162 to flow to buffered read bit line 174 (one of read bit lines 122 in FIG. 6) via buffer 176.

Figure 8:
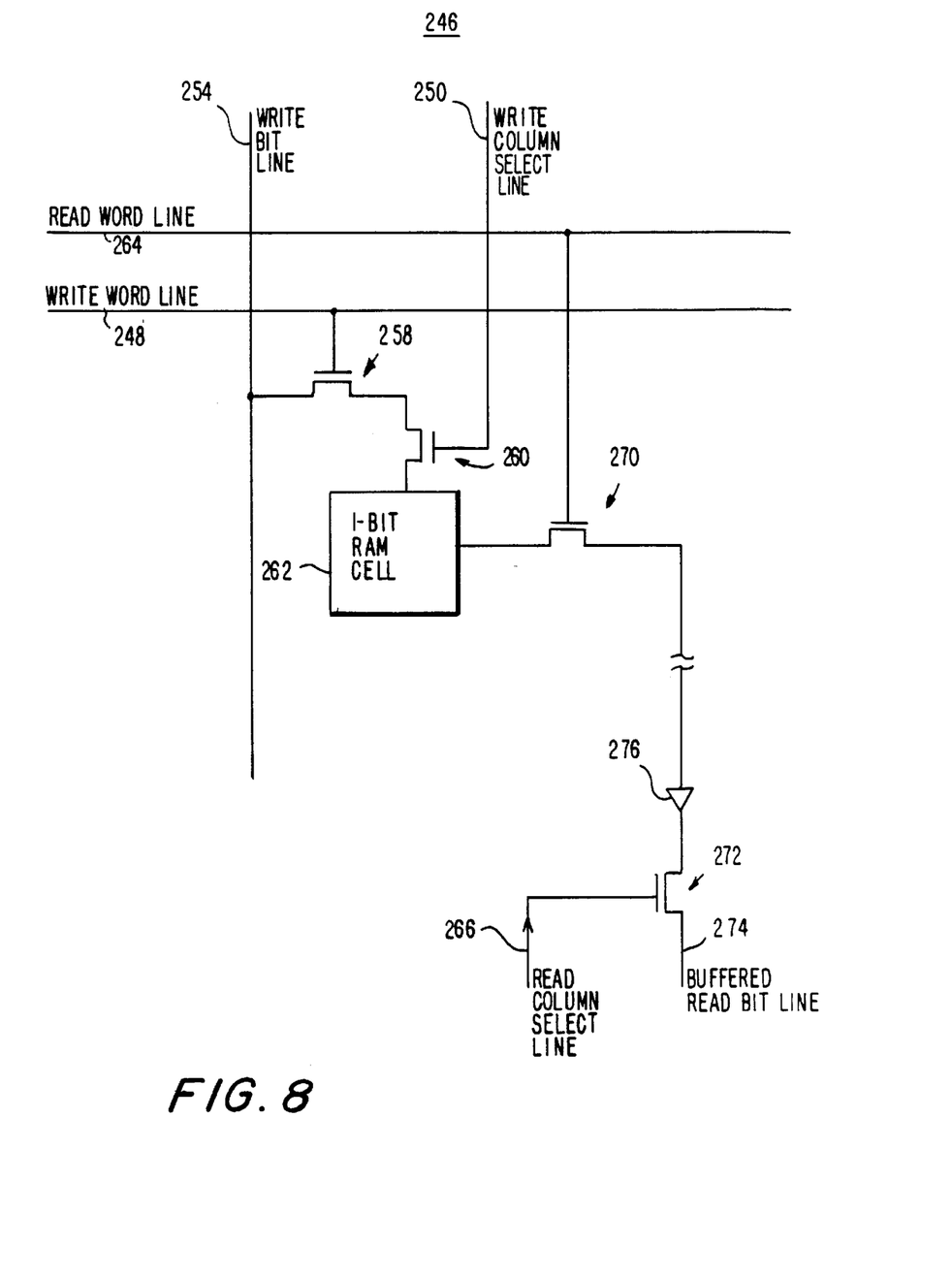
FIG. 8 is a diagram of another memory array cell suitable for use in a dual-port variable depth and width memory array in accordance with the present invention.

Another suitable data storage cell arrangement for a cell in array 92 is shown in FIG. 8. Data may be written into cell 246 by taking write word line 248 (one of write word lines 112 in FIG. 6) high with write row address decoder 110 (FIG. 6) and taking write column selection line 250 (one of write column selection lines 152 in FIG. 6) high with write column decoder and data selection logic 106 (FIG. 6) while supplying data to cell 246 via write bit line 254 (one of write bit lines 156 in FIG. 6) using write column decoder and data selection logic 106 (FIG. 6). This turns on transistors 258 and 260 and causes the data on write bit line 254 to flow into one-bit random access memory (RAM) cell 262.

Data may be read from cell 246 by taking read word line 264 (one of read word lines 138 in FIG. 6) high with read row address decoder 136 (FIG. 6) and taking read column selection line 266 (one of read column selection lines 168 in FIG. 6) high with read column decoder and data selection logic 120 (FIG. 6). This turns on read word line selection transistor 270 and read column select line transistor 272 and causes the data in one-bit random access memory (RAM) cell 262 to flow to buffered read bit line 274 (one of read bit lines 122 in FIG. 6) via buffer 276.

The memory cell arrangement of FIG. 8 is advantageous because only one row of transistors 272 is used per array 92. In particular, 32 transistors 272 may be used in array 92 and may be located along the bottom edge of array 92 as depicted in FIG. 6. The arrangement of FIG. 7 uses transistors 172 to control the reading of data from selected columns. However, the arrangement of FIG. 7 requires the use of a transistor 172 in each cell of array 92, rather than the single row of read column select line transistors 272 that are used in the arrangement of FIG. 8.

Cells 146, cells 246, or any other suitable memory cell arrangement may be used if desired. For clarity, the present discussion focuses on use of memory cells 146, but this choice of memory cell is illustrative only.

The arrangement of dual-port variable depth and width memory array 84 of FIG. 6 allows simultaneous read and write operations to be performed using selectable-size data words. Read operations involve taking one of read word lines 138 high to select a row of array 92. Write operations involve taking one of write word lines 112 high to select a row of array 92. Simultaneous read and write operations may involve simultaneously taking a read word line 138 and a write word line 112 high in the same row, provided that the columns of array 92 that are selected for reading differ from the columns that are selected for writing.

When performing a write operation, one, two, four, eight, or sixteen of the columns of memory cells 146 in array 92 may be selected at a time, depending on whether write column decoder and data selection logic 106 is placed in the ×1, ×2, ×4, ×8, or ×16 mode. In the ×1 mode, five bits of write column address information on write address path 118 are used to select a single column from the 32 columns of array 92. In the ×2 mode, four bits of write column address information are used to specify the group of two columns into which data is to be written. In the ×4 mode, three bits of write column address information are used to specify the group of four columns of array 92 into which data is to be written. In the ×8 mode, two bits of write column address information are used to specify the group of eight columns of array 92 into which data is to be written. In the ×16 mode, one bit of write column address information is used to specify the group of sixteen columns of array 92 into which data is to be written.

Writing data into a given column of memory cells 146 involves taking the write column select line 150 for that column high while providing the data for the column from input registers 106 to the write bit line 154 for the column using write column decoder and data selection logic 106. The columns that are selected when a group of more than one column of cells 146 is selected at a time (e.g., when four columns are selected in the ×4 mode) are typically adjacent.

When performing a read operation, one, two, four, eight, or sixteen of the columns of memory cells 146 in array 92 may be selected at a time, depending on whether read column decoder and data selection logic 120 is placed in the ×1, ×2, ×4, ×8, or ×16 mode. In the ×1 mode, five bits of read column address information on read address path 144 are used to select a single column from the 32 columns of array 92. In the ×2 mode, four bits of read column address information are used to specify the group of two columns from which data is to be read. In the ×4 mode, three bits of read column address information are used to specify the group of four columns of array 92 from which data is to be read. In the ×8 mode, two bits of read column address information are used to specify the group of eight columns of array 92 from which data is to be read. In the ×16 mode, one bit of read column address information is used to specify the group of sixteen columns of array 92 from which data is to be read.

Reading data from a given column of memory cells 146 involves taking the read column select line 166 for that column high while monitoring the corresponding buffered read bit line 174 with read column decoder and data selection logic 120. The columns that are selected when a group of more than one column of cells 146 is selected at a time (e.g., when four columns are selected in the ×4 mode) are typically adjacent.

Because the column selection functions of write column decoder and data selection logic 106 operate essentially independently from the column selection functions of read column decoder and data selection logic 120, one process implemented in programmable logic device 82 may be writing data to array 92 while another process implemented in programmable logic device 82 may be reading data from array 92.

Figure 9:
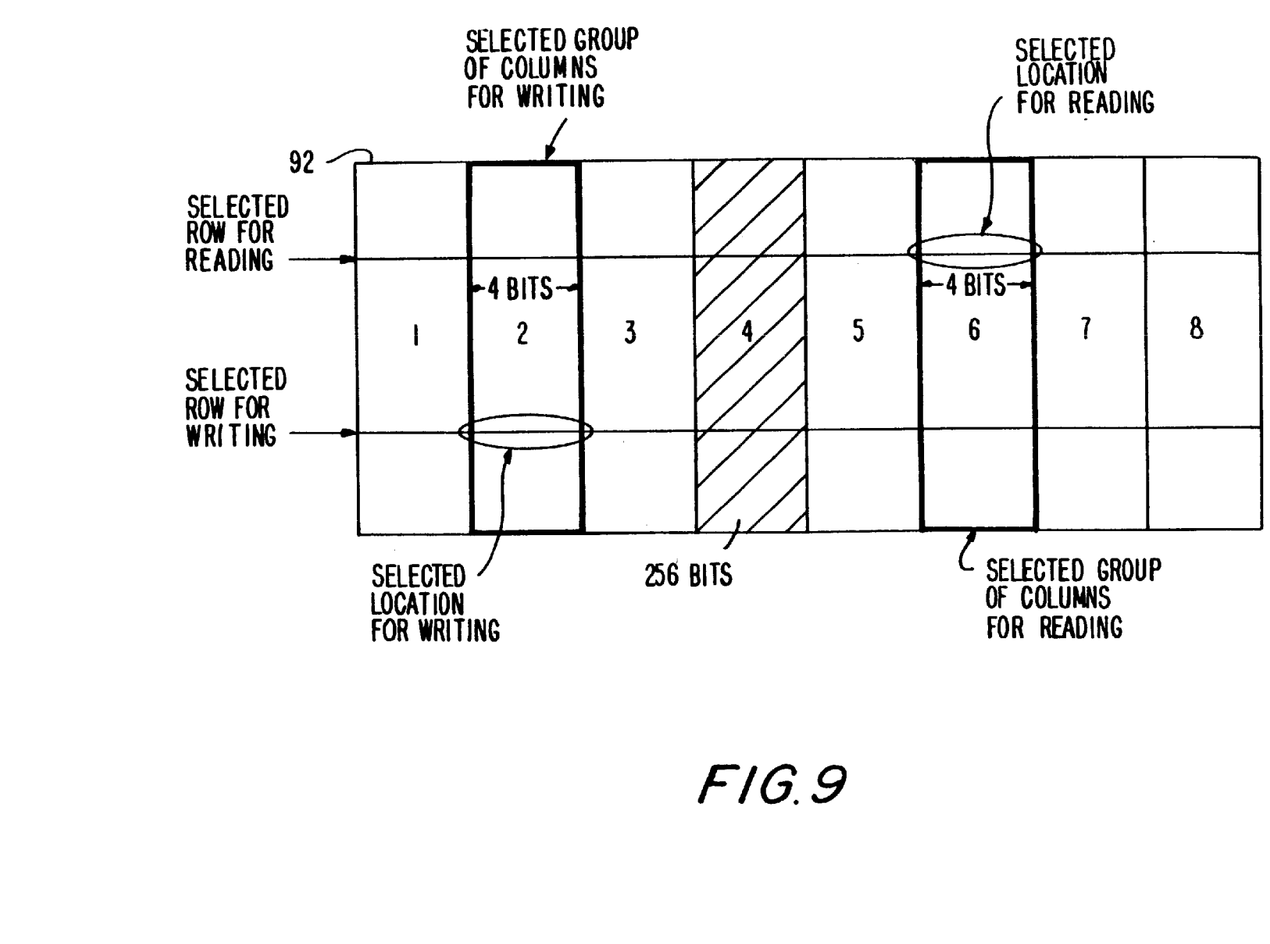
FIG. 9 is a diagram that illustrates the concurrent addressing of one selected memory location for writing and another selected memory location for reading in a dual-port variable depth and width memory array in accordance with the present invention.

The ability of dual-port variable depth and width array 84 to support simultaneous read and write operations is illustrated in FIG. 9, in which a four-bit write operation is being performed at a selected location for writing while a four-bit read operation is being performed at a selected location for reading. When using the ×4 mode for concurrent read and write operations as shown in FIG. 9, array 92 may be thought of as being partitioned into eight four-column groups of columns each of which has a capacity of 256 bits (see, e.g., group 4). Because there are eight groups and each group has 64 four-bit words, there are a total of 512 four-bit words in array 92, which allows array 92 to operate in the 512×4 configuration in the ×4 mode.

The location for writing a desired four-bit data word can be specified by selecting one of these groups of columns using four of the write column select lines 152 of FIG. 6. For example, write column decoder and data selection logic 106 of FIG. 6 may be used to select the columns in group 2 of FIG. 9 by taking the four column select lines 152 associated with group 2 high.

The location for reading a desired four-bit data word can be specified by selecting one of the groups of columns using four of the read column select lines 168 of FIG. 6. For example, read column decoder and data selection logic 120 of FIG. 6 may be used to select the columns in group 6 of FIG. 9 by taking the four read column select lines 168 of FIG. 6 that are associated with group 6 high.

In the ×1 mode, array 92 can be partitioned into 32 groups of columns each of which is one bit wide. In the ×2 mode, array 92 can be partitioned into 16 groups of columns each of which is two bits wide. In the ×8 mode, array 92 can be partitioned into four groups, each of which is eight bits wide. In the ×16 mode, array 92 can be partitioned into two groups, each of which is 16 bits wide.

The ability of the dual-port memory array arrangement of FIG. 6 to perform concurrent read and write operations allows the user of programmable logic device 82 (FIG. 5) to implement first-in-first-out buffers and other such memory arrangements using memory array 84.

Figure 10:
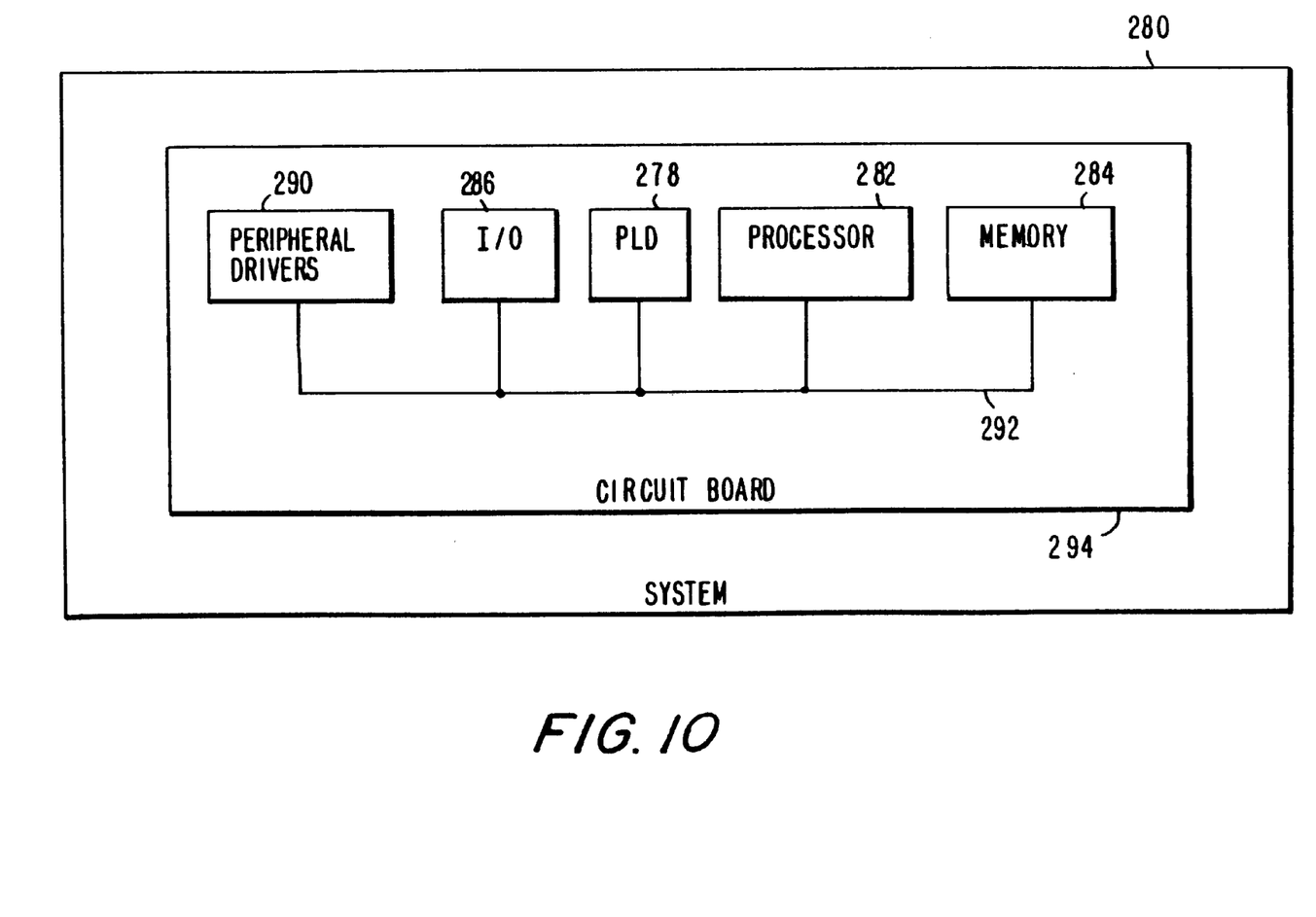
FIG. 10 is a diagram of a system in which a programmable logic device having the dual-port variable depth and width memory array circuitry of the present invention may be used.

The foregoing arrangements are typically used in programmable logic devices that are made part of larger systems. FIG. 10 shows a programmable logic device 278 containing the dual-port variable depth and width memory array circuitry of this invention in use in a data processing system 280. Data processing system 280 may include one or more of the following components: a processor 282, memory 284, I/O circuitry 286, and peripheral drivers 290. These components are coupled together by a system bus 292 and populate a circuit board 294 that is contained in system 280.

System 280 may be used in a wide variety of applications, such as computer networking, data networking, instrumentation, video processing, digital signal processing, or any other application where the advantage of using programmable logic is desirable. Programmable logic device 278 may be used to perform a variety of different logic functions. For example, programmable logic device 278 may be configured as a processor or controller that works in cooperation with processor 282. Programmable logic device 278 may also be used as an arbiter for arbitrating access to a shared resource in system 280. In yet another example, programmable logic device 278 may be configured as an interface between processor 282 and one of the other components in system 280.

The programmable connections made between various components in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention. For example, the number of rows and columns of memory array cells that are used 's not critical. In addition, the ×2, ×4, ×8, and ×16 modes used in the variable depth and width memory array are illustrative. Modes supporting different word sizes may be used if desired.

What is claimed is:

1. A programmable logic device comprising:

a plurality of programmable logic regions;

a dual-port variable depth and width memory block comprising:

a memory array having a plurality of rows and columns of memory cells for storing data;

variable depth and width writing circuitry for performing write operations with selectable-size data words by addressing selected write locations within the memory array and by writing data words into those write locations; and variable depth and width reading circuitry for performing read operations with selectable-size data words concurrently with the write operations performed by the writing circuitry by addressing selected read locations within the memory array and by reading data words from those read locations; and a plurality of interconnects for routing signals between the programmable logic regions and the dual-port variable depth and width memory block.

2. The programmable logic device of claim 1 wherein the dual-port variable depth and width memory block operates in at least ×1, ×2, ×4, ×8 and ×16 data width modes.

3. The programmable logic device of claim 2 wherein the writing circuitry comprises:

a write column decoder and data selection logic responsive to write column address information; and the reading circuitry comprises a read column decoder and data selection logic responsive to read column address information.

4. The programmable logic device of claim 1 wherein the programmable logic regions contain a plurality of programmable logic subregions.

5. The programmable logic device of claim 1 wherein the memory array is a static random-access memory (SRAM) array.

6. A method for concurrently writing to and reading data from a variable depth and width dual-port memory array having a plurality of rows and columns of memory cells for storing data in a programmable logic device having logic circuitry, comprising:

performing write operations with selectable-size data words by addressing selected write locations within the memory array and by writing data words into those write locations; and performing read operations with selectable-size data words concurrently with the write operations performed by the writing circuitry by addressing selected read locations within the memory array and by reading data words from those read locations.

7. The method of claim 6 further comprising using input registers to register the data words to be written to the memory array.

8. The method of claim 6 further comprising using output registers to register the data words that have been read from the memory array.

9. The method of claim 6 further comprising performing the write operations independently from the read operations.

10. The programmable logic device of claim 1 wherein the memory block implements a first-in-first-out-buffer.

11. A programmable logic device comprising:

a plurality of programmable logic regions;

a dual-port variable depth and width memory block comprising:
a memory array having a plurality of rows and columns of memory cells for storing data;
a first port for writing selectable-size data words into selected write locations within the memory array; and
a second port for concurrently reading selectable-size data words from selected read locations within the memory array; and a plurality of interconnects for routing signals between the programmable logic regions and the dual-port variable depth and width memory block.

12. The programmable logic device of claim 11 wherein the dual-port variable depth and width memory block operates in at least ×1, ×2, ×4, ×8 and ×16 data width modes.

13. The programmable logic device of claim 11 wherein the programmable logic regions contain a plurality of programmable logic subregions.

14. The programmable logic device of claim 11 wherein the dual-port variable depth and width memory block further comprises:

variable depth and width writing circuitry for performing write operations with selectable-size data words by addressing selected write locations within the memory array and by writing data words into those write locations; and variable depth and width reading circuitry for performing read operations with selectable-size data words concurrently with the write operations performed by the writing circuitry by addressing selected read locations within the memory array and by reading data words from those read locations.

15. A digital processing system comprising:

a processor;

a memory coupled to the processor; and a programmable logic device coupled to the processor and the memory, the programmable logic device having:

a plurality of programmable logic regions;

a dual-port variable depth and width memory block comprising:
a memory array having a plurality of rows and columns of memory cells for storing data;
variable depth and width writing circuitry for performing write operations with selectable-size data words by addressing selected write locations within the memory array and by writing data words into those write locations; and
variable depth and width reading circuitry for performing read operations with selectable-size data words concurrently with the write operations performed by the writing circuitry by addressing selected read locations within the memory array and by reading data words from those read locations; and a plurality of interconnects for routing signals between the programmable logic regions and the dual-port variable depth and width memory block.

16. The digital processing system defined in claim 15 further comprising a circuit board on which the memory, the processor, and the programmable logic device are mounted.

17. The digital processing system defined in claim 15 further comprising input/output circuitry coupled to the programmable logic device, the processor, and the memory.

18. The digital processing system defined in claim 15 further comprising peripheral drivers coupled to the programmable logic device, the processor, and the memory.

19. A digital processing system comprising:

a processor;

a memory coupled to the processor; and a programmable logic device coupled to the processor and the memory, the programmable logic device having:

a plurality of programmable logic regions;

a dual-port variable depth and width memory block comprising:
a memory array having a plurality of rows and columns of memory cells for storing data;
a first port for writing selectable-size data words into selection write locations within the memory array; and
a second port for concurrently reading selectable-size data words from select read locations within the memory array; and a plurality of interconnects for routing signals between the programmable logic regions and the dual-port variable depth and width memory block.

20. The digital processing system defined in claim 19 further comprising a circuit board on which the memory, the processor, and the programmable logic device are mounted.

21. The digital processing system defined in claim 19 further comprising input/output circuitry coupled to the programmable logic device, the processor, and the memory.

22. The digital processing system defined in claim 19 further comprising peripheral drivers coupled to the programmable logic device, the processor, and the memory.

* * * * *